United States Patent
Goel et al.

(10) Patent No.: US 9,672,898 B1
(45) Date of Patent: Jun. 6, 2017

(54) READ COLUMN SELECT NEGATIVE BOOST DRIVER CIRCUIT, SYSTEM, AND METHOD

(71) Applicant: Samsung Electronics Co., Ltd., Suwon-si, Gyeonggi-do (KR)

(72) Inventors: Sumeer Goel, Austin, TX (US); Kenneth D. Hicks, Austin, TX (US)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 15/281,059

(22) Filed: Sep. 29, 2016

Related U.S. Application Data (60) Provisional application No. 62/375,406, filed on Aug. 15, 2016.

(51) Int. Cl.
*G11C 11/00* (2006.01)
*G11C 11/418* (2006.01)
*G11C 11/419* (2006.01)

(52) U.S. Cl.
CPC .......... *G11C 11/418* (2013.01); *G11C 11/419* (2013.01)

(58) Field of Classification Search
CPC .............................. G11C 11/418; G11C 11/419

USPC .......................................................... 365/154
See application file for complete search history.

(56) References Cited

U.S. PATENT DOCUMENTS

| | | | | |
|---|---|---|---|---|
| 7,366,007 | B2* | 4/2008 | Kanehara | G11C 7/1006 365/154 |
| 8,120,975 | B2* | 2/2012 | Kenkare | G11C 11/419 365/154 |
| 8,223,567 | B2 | 7/2012 | Abu Rahma et al. | |
| 8,988,960 | B2 | 3/2015 | Huang et al. | |
| 2011/0103123 | A1* | 5/2011 | Nakaoka | G11C 11/4074 365/63 |

* cited by examiner

*Primary Examiner* — Tha-O H Bui
(74) *Attorney, Agent, or Firm* — Renaissance IP Law Group LLP (57) ABSTRACT

Embodiments include a read column select negative boost driver of a memory device. The negative boost driver may include a negative boost element coupled to a P-type metal-oxide-semiconductor (PMOS) pass gate, and configured to negatively boost a read column select signal below a negative power supply level VSS dependent on a boost control signal. The negative boost driver may further include an N-type metal-oxide-semiconductor (NMOS) boost control transistor coupled to the negative boost element and to a read column select inverter, and configured to tri-state the read column select inverter dependent on the boost control signal.

20 Claims, 8 Drawing Sheets

FIG. 7
(CONVENTIONAL)

READ COLUMN SELECT NEGATIVE BOOST DRIVER CIRCUIT, SYSTEM, AND METHOD

BACKGROUND

Static random-access memory (SRAM) is a type of volatile memory used in computing systems. SRAM is faster than other kinds of memory. For this reason, SRAM is typically used in high-speed caches for central processing units (CPUs), while other types of volatile memory such as dynamic random access memory (DRAM) is typically used in the main memory of a computer.

Typically, a low swing SRAM read circuit has a P-type metal-oxide-semiconductor (PMOS) pass gate between an array bit cell (i.e., memory cell) and a sensing circuit (e.g., sense amplifier). The PMOS pass gate provides isolation between the array bit lines and the sense lines, and often functions as a column multiplexer as well. The PMOS pass gate has a threshold drop across the device when passing a low signal. Hence, the sense lines saturate at a threshold voltage (Vt) above a ground supply voltage (VSS).

Control signals of an SRAM circuit are typically sequenced to enable reading of the SRAM. The control signals may include, for example, a word line, a row column select signal, a sense amplifier enable signal, and a precharge signal. The array bit cell must pull the sense nodes low enough to establish the required differential voltage for correct sensing when the sense amplifier enable signal goes high.

Lowering the power consumption of mobile devices, such as smart phones, increases the battery life and operating timeframes between charges. One way to lower the power consumption is to lower a power supply voltage (VDD). However, as the power supply voltage VDD provided to a SRAM circuit is decreased, the ability to pull the sense node low enough for proper sensing through the PMOS pass gate is limited by the device threshold voltage (Vt). This limits the lowest operating voltage, or $V_{MIN}$, of the memory, and ultimately of the product.

BRIEF SUMMARY

Some embodiments may include a read column select negative boost driver of a memory device. The negative boost driver may include a negative boost element coupled to a P-type metal-oxide-semiconductor (PMOS) pass gate, and configured to negatively boost a read column select signal below a negative power supply level VSS dependent on a boost control signal. The negative boost driver may further include an N-type metal-oxide-semiconductor (NMOS) boost control transistor coupled to the negative boost element and to a read column select inverter, and configured to tri-state the read column select inverter dependent on the boost control signal.

Some embodiments may include a static random access memory (SRAM). The SRAM may include a memory cell array including a plurality of memory cells arranged in columns, wherein each of the memory cells is coupled to a corresponding P-type metal-oxide-semiconductor (PMOS) pass gate from among a plurality of PMOS pass gates. The SRAM may further include a sense amplifier section including a plurality of sense amplifiers, wherein each of the sense amplifiers is associated with a corresponding one of the columns. The SRAM may further include a plurality of negative boost elements each coupled to a corresponding PMOS pass gate from among the plurality of PMOS pass gates, and configured to negatively boost a read column select signal below a negative power supply level VSS dependent on a boost control signal. The SRAM may further include a plurality of N-type metal-oxide-semiconductor (NMOS) boost control transistors each coupled to a corresponding one of the negative boost elements and to a corresponding read column select inverter from among a plurality of read column select inverters, and configured to tri-state the corresponding read column select inverter dependent on the boost control signal.

BRIEF DESCRIPTION OF THE DRAWINGS

The foregoing and additional features and advantages of the present inventive principles will become more readily apparent from the following detailed description, made with reference to the accompanying figures, in which.

DETAILED DESCRIPTION

Reference will now be made in detail to embodiments of the inventive concept, examples of which are illustrated in the accompanying drawings.

Figure 1:
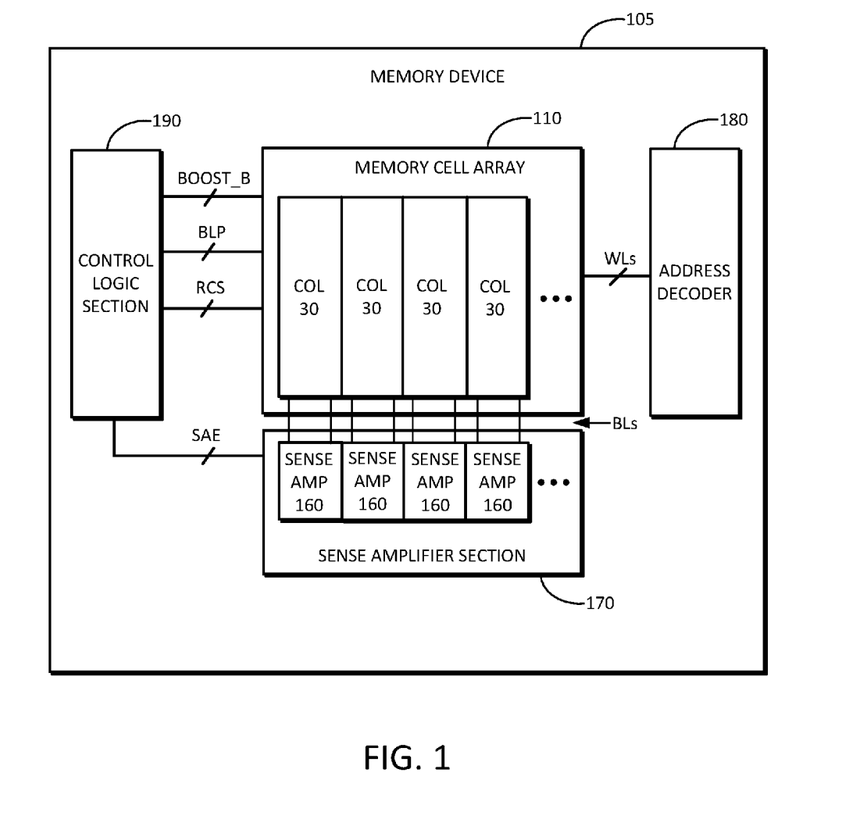
FIG. 1 is an example block diagram of a memory device including a memory cell array arranged in columns in accordance with some embodiments.

FIG. 1 is an example block diagram of a memory device 105 including a memory cell array 110 having memory cells arranged in columns 30 in accordance with some embodiments. The memory device 105 may further include a sense amplifier section 170, an address decoder 180, and a control logic section 190.

The sense amplifier section 170 may include sense amplifiers 160 for sensing or reading bit information stored in the memory cell array 110. The sense amplifier section 170 may be coupled to the memory cell array 110 via the bit lines BLs. Each of the sense amplifiers 160 may be associated with a corresponding one of the columns 30. For example, each of the sense amplifiers 160 may be coupled to memory cells in a particular column 30 of the memory cell array 110 via bit lines BLs. The sense amplifier section 170 may operate responsive to the control of the control logic section 190. For example, the sense amplifier section 170 may receive a sense amplifier enable signal (SAE) from the control logic section 190. The sense amplifier section 170 may receive power (e.g., a voltage or a current) from the control logic section 190, and provide the power to a selected or unselected bit line.

The address decoder 180 may be coupled to the memory cell array 110 via the word lines WLs. The address decoder 180 may operate responsive to the control of the control logic section 190. The address decoder 180 may decode an input address to select the word lines WLs. The address decoder 180 may provide power (e.g., a voltage or a current) to a selected or unselected word line.

The control logic section 190 may control an operation of the memory device 105. The control logic section 190 may be supplied with external power and/or control signals. The control logic section 190 may generate power needed for an internal operation using the external power. The control logic section 190 may control read, write, and/or erase operations in response to the control signals. The control logic section 190 may generate a boost control signal BOOST_B, which may be provided to the memory cell array 110, as further described in detail below. In addition, the control logic section 190 may generate a precharge signal BLP_B and a row column select signal RCS, which may be provided to the memory cell array 110, as also further described in detail below.

Figure 2:
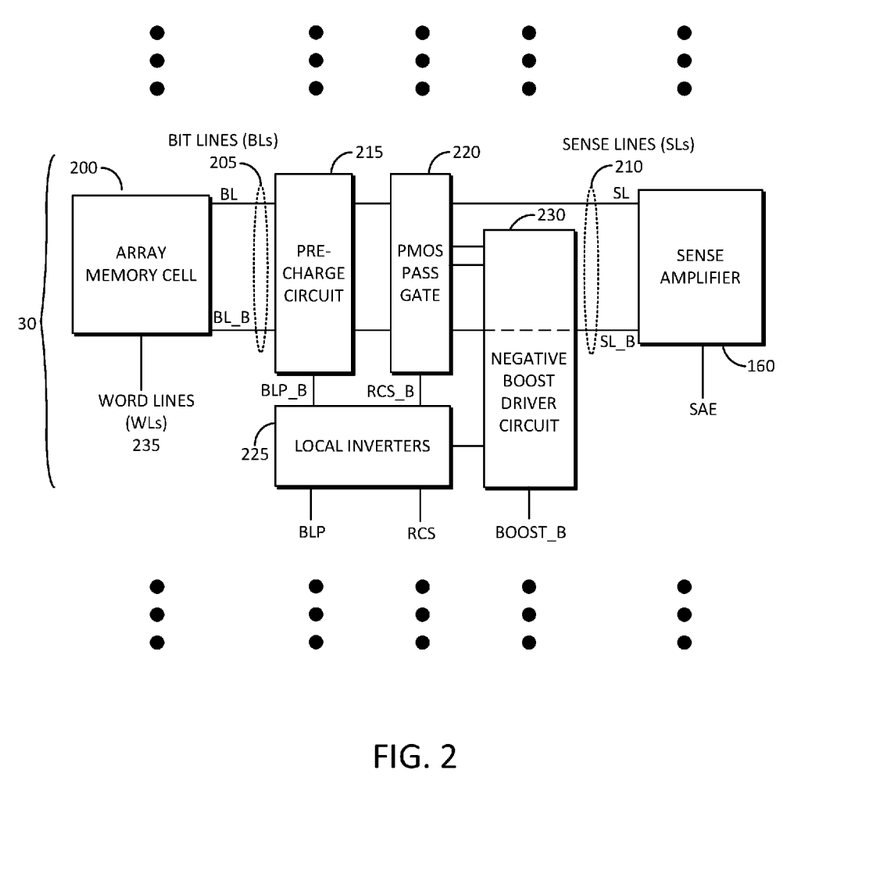
FIG. 2 is an example block diagram of a column of the memory cell array of the memory device of FIG. 1, including a negative boost circuit in accordance with some embodiments.

FIG. 2 is an example block diagram of a column 30 of the memory cell array 110 of the memory device 105 of FIG. 1, including a negative boost circuit 230 in accordance with some embodiments. The memory cell array 110 may include a plurality of memory cells (e.g., array memory cell 200), each of which may store one or more data bits. The array memory cells 200 may be coupled to one or more word lines (WLs) 235. The array memory cells 200 may be coupled to a plurality of bit lines (BLs) 205. The bit lines 205 may include a first bit line (BL) and a second inverted bit line (BL_B). Each of the bit lines 205 has a corresponding current sense amplifier (e.g., 160) associated therewith. More specifically, the bit lines 205 may be coupled to the sense amplifier 160 by way of a precharge circuit 215, a P-type metal-oxide-semiconductor (PMOS) pass gate 220, and sense lines (SLs) 210. The sense lines 210 connect the sense amplifier 160 to the PMOS pass gate 220. The bit lines 205 connect the array memory cell 200 to the PMOS pass gate 220.

Local inverters 225 may be coupled to the precharge circuit 215 and the PMOS pass gate 220. In a modern sub-nanometer process, the interconnects between elements have high resistance and capacitance. The control signals (e.g., BLP and RCS) from the control logic section 190 to the column 30 may be inverted locally (e.g., by local inverters 225) and/or buffered.

The sense amplifier 160 may receive the SAE signal from the control logic section 190 (e.g., of FIG. 1). The SAE signal causes the sense amplifier 160 to sense a voltage differential across the sense amplifier 160. The column 30 may include a negative boost driver circuit 230, as further described in detail below. The negative boost driver circuit 230 may receive the boost control signal BOOST_B from the control logic section 190 (e.g., of FIG. 1). The negative boost driver circuit 230 may be coupled to one or more of the local inverters 225. The negative boost driver circuit 230 may negatively boost a read column select signal below a negative power supply level VSS dependent on the boost control signal BOOST_B contemporaneously with the negative boost drive circuit 230 tri-stating one or more of the local inverters 225, as further described in detail below.

Figure 3:
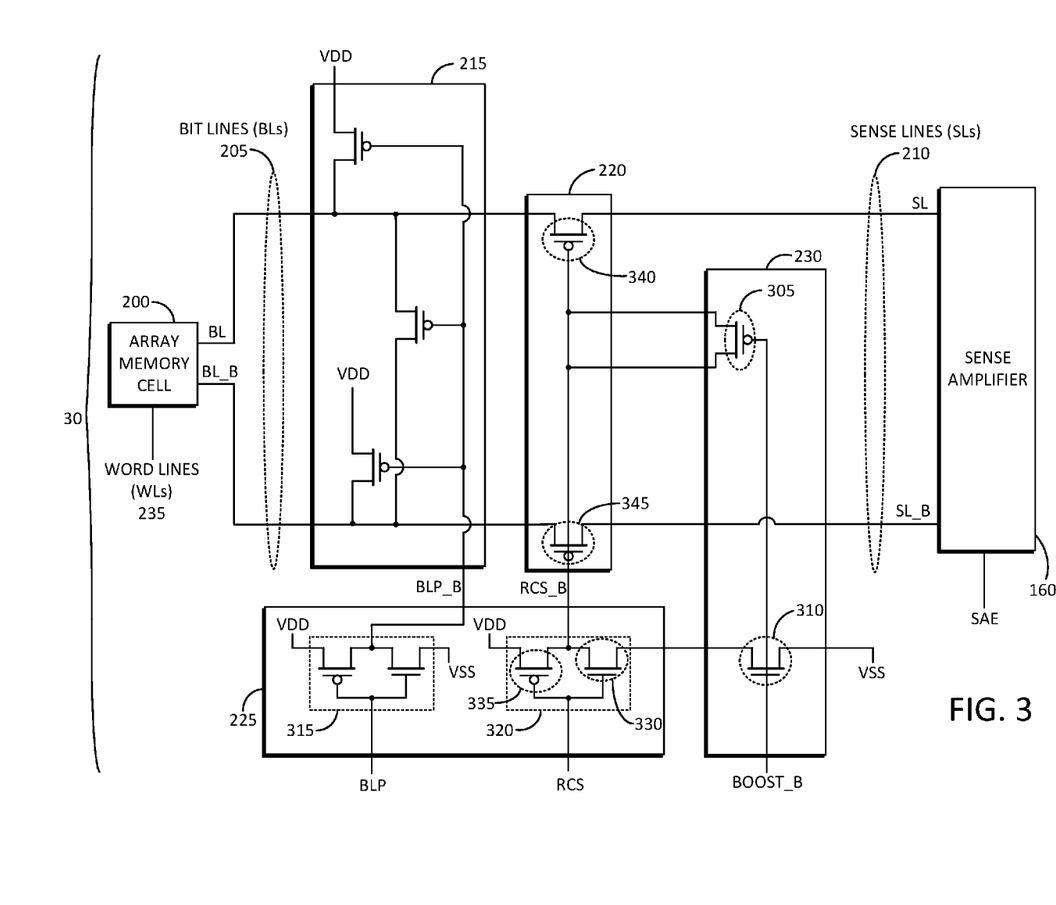
FIG. 3 is an example circuit diagram of a column of the memory cell array of the memory device of FIG. 1, including a first example of a negative boost circuit in accordance with some embodiments.

FIG. 3 is an example circuit diagram of a column 30 of the memory cell array 110 of the memory device 105 of FIG. 1, including a first example of a read column select negative boost driver circuit 230 in accordance with some embodiments. The local inverters 225 may include a precharge inverter 315 and a read column select inverter 320. The read column select negative boost driver circuit 230 may include a negative boost element 305 coupled to the PMOS pass gate 220. In some embodiments, the negative boost element 305 is a PMOS transistor.

The negative boost PMOS transistor 305 may negatively boost a read column select signal (e.g., RCS_B) below a negative power supply level VSS dependent on the boost control signal BOOST_B. An N-type metal-oxide-semiconductor (NMOS) boost control transistor 310 may be coupled to the negative boost PMOS transistor 305 and to the read column select inverter 320. The NMOS boost control transistor 310 may tri-state the read column select inverter 320 dependent on the boost control signal BOOST_B, as further described in detail below. The boost control signal BOOST_B may drive the negative boost PMOS transistor 305 to couple a PMOS gate voltage of the PMOS pass gate 220 below the negative power supply level VSS in order to increase the voltage across the gate-source (Vgs) across the PMOS pass gate 220. This allows a lower voltage to pass through the PMOS pass gate 220.

According to some embodiments, adequate sense differential is provided at low operating supply voltages while still providing for isolation between an array bit cell (e.g., 200) and a sense amplifier (e.g., 160). The negative boost driver circuit 230 may tri-state the local read column select inverter 320, which allows the read column select signal (e.g., RCS_B) to couple below the negative power supply level VSS with the aid of a boost capacitance from the negative boost PMOS transistor 305. The tri-stating of the read column select inverter 320 and negative boosting of the read column select signal RCS_B are achieved with the same control signal (i.e., BOOST_B), thereby significantly minimizing the devices required for the implementation. The NMOS boost control transistor 310 may function as a tri-state driver. The tri-state driver and the boost capacitance may be implemented using only two circuit elements, and may be physically disposed in the column 30, resulting in only a small increase in area. And any increase in power consumption due to the two additional circuit elements in the column 30 is more than offset by a reduction in the power supply level VDD.

After the RCS_B signal reaches the negative power supply level VSS, the BOOST_B signal may be used as an aggressor to couple the RCS_B signal below the negative power supply level VSS. The same BOOST_B signal also turns OFF the NMOS boost control transistor 310, thereby cutting off the path from RCS_B to VSS, thereby tri-stating the RCS_B driver 320. This allows the RCS_B signal to stay below the negative power supply level VSS until sensing is complete.

In some embodiments, a gate of the boost control transistor 310 may receive the boost control signal BOOST_B. In some embodiments, a source of the boost control transistor 310 may be coupled to the negative power supply level VSS. The boost control transistor 310 may pass the negative power supply level VSS to the read column select inverter 320 responsive to the boost control signal BOOST_B to tri-state the read column select inverter 320. The negative boost PMOS transistor 305 may negatively boost the read column select signal (e.g., RCS_B) below the negative power supply level VSS responsive to the boost control signal BOOST_B contemporaneously with the read column select inverter 320 being tri-stated by the NMOS boost control transistor 310.

The read column select inverter 320 may include an NMOS transistor 330 and a PMOS transistor 335. The boost control transistor 310 may be coupled to the NMOS transistor 330 of the read column select inverter 320. The read column select signal RCS_B may be referred to as an inverted read column select signal RCS_B. In some embodiments, a gate of the NMOS transistor 330 of the read column select inverter 320 may receive a non-inverted read column select signal RCS. In some embodiments, a gate of the PMOS transistor 335 of the read column select inverter 320 may receive the non-inverted read column select signal RCS. In some embodiments, a drain of the boost control transistor 310 may be coupled to a source of the NMOS transistor 330 of the read column select inverter 320.

The PMOS pass gate 320 includes a first PMOS transistor 340 and a second PMOS transistor 345. The negative boost PMOS transistor 305 may be coupled to a gate of the first PMOS transistor 340 and to a gate of the second PMOS transistor 345 of the PMOS pass gate 220. In some embodiments, a drain of the NMOS transistor 330 of the read column select inverter 320 may be coupled to the gate of the first PMOS transistor 340 of the PMOS pass gate 220, and to the gate of the second PMOS transistor 345 of the PMOS pass gate 220. In some embodiments, a drain of the PMOS transistor 335 of the read column select inverter 320 may be coupled to the gate of the first PMOS transistor 340 of the PMOS pass gate 220, and to the gate of the second PMOS transistor 345 of the PMOS pass gate 220. In some embodiments, a source of the PMOS transistor 335 of the read column select inverter 320 may be coupled to a positive power supply level VDD.

In some embodiments, a gate of the negative boost PMOS transistor 305 may receive the boost control signal BOOST_B. In some embodiments, a source of the negative boost PMOS transistor 305 may be coupled to a gate of the first PMOS transistor 340 of the PMOS pass gate 220, and to a gate of the second PMOS transistor 345 of the PMOS pass gate 220. In addition, a drain of the negative boost PMOS transistor 305 may be coupled to the gate of the first PMOS transistor 340 of the PMOS pass gate 220, and to the gate of the second PMOS transistor 345 of the PMOS pass gate 220.

In some embodiments, a memory cell array (e.g., 110 of FIG. 1) includes a plurality of memory cells (e.g., 200) arranged in columns (e.g., 30 of FIG. 1). Each of the memory cells 200 may be coupled to a corresponding PMOS pass gate 220 from among a plurality of PMOS pass gates. In some embodiments, a sense amplifier section (e.g., 170 of FIG. 1) may include a plurality of sense amplifiers 160. Each of the sense amplifiers 160 may be associated with one of the columns 30. In some embodiments, a plurality of negative boost elements (e.g., 305) are each coupled to a corresponding PMOS pass gate 220 from among the plurality of PMOS pass gates. The plurality of negative boost elements (e.g., 305) may negatively boost a corresponding read column select signal (e.g., RCS_B) below a negative power supply level VSS dependent on the boost control signal BOOST_B.

In some embodiments, a plurality of NMOS boost control transistors (e.g., 310) are each coupled to a corresponding one of the negative boost elements (e.g., 305) and to a corresponding read column select inverter (e.g., 320) from among a plurality of read column select inverters. The plurality of NMOS boost control transistors (e.g., 310) may tri-state the corresponding read column select inverter (e.g., 320) dependent on the boost control signal BOOST_B. In some embodiments, a source of each of the boost control transistors 310 is coupled to the negative power supply level VSS.

Each of the boost control transistors (e.g., 310) may pass the negative power supply level VSS to a corresponding read column select inverter (e.g., 320) from among the plurality of read column select inverters responsive to the boost control signal BOOST_B to tri-state the corresponding read column select inverter (e.g., 320). Moreover, each of the negative boost elements (e.g., 305) may negatively boost the read column select signal RCS_B below the negative power supply level VSS responsive to the boost control signal BOOST_B contemporaneously with the corresponding read column select inverter (e.g., 320) being tri-stated by the corresponding boost control transistor (e.g., 310).

Figure 4:
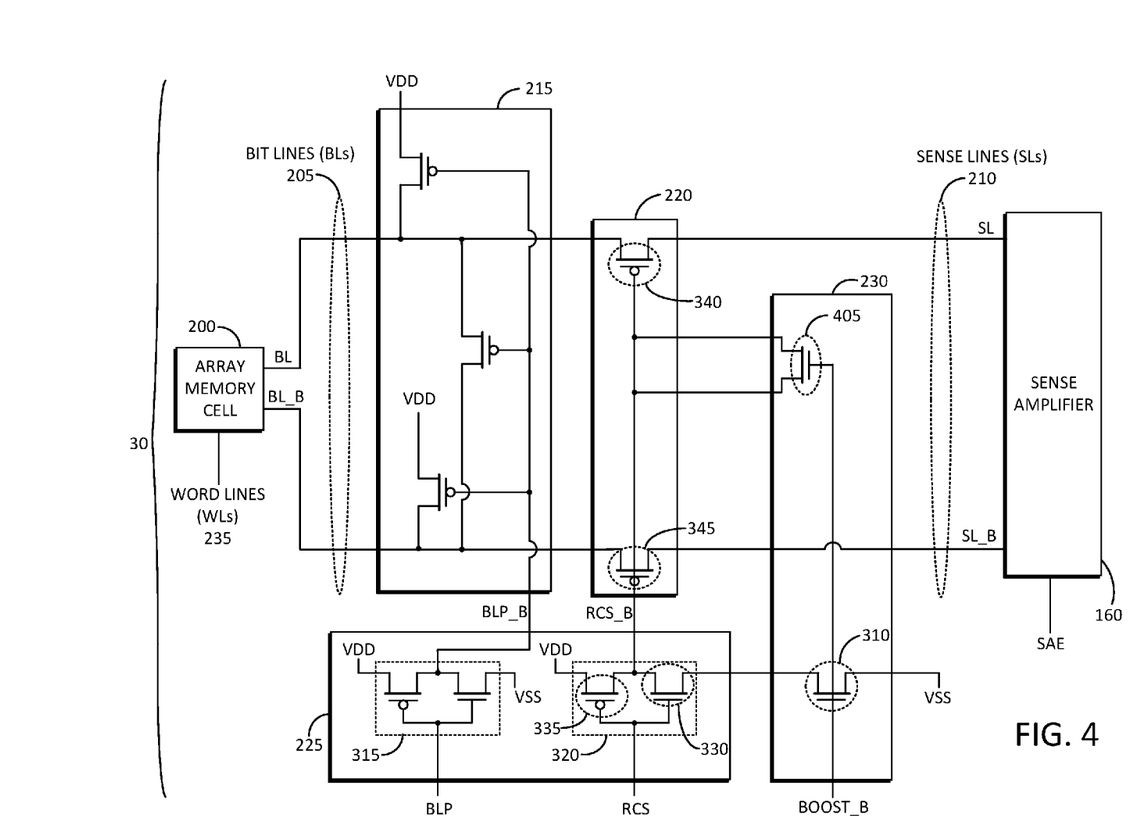
FIG. 4 is an example circuit diagram of a column of the memory cell array of the memory device of FIG. 1, including a second example of a negative boost circuit in accordance with some embodiments.

FIG. 4 is an example circuit diagram of a column of the memory cell array of the memory device of FIG. 1, including a second example of a negative boost circuit in accordance with some embodiments. Some of the elements of FIG. 4 are described above with reference to FIG. 3, and therefore, a detailed description of such elements is not necessarily repeated. In some embodiments, the negative boost circuit 230 includes a negative boost element 405. The negative boost element 405 may be an NMOS transistor.

The negative boost NMOS transistor 405 may negatively boost a read column select signal (e.g., RCS_B) below a negative power supply level VSS dependent on the boost control signal BOOST_B. The NMOS boost control transistor 310 may be coupled to the negative boost NMOS transistor 405 and to the read column select inverter 320. The NMOS boost control transistor 310 may tri-state the read column select inverter 320 dependent on the boost control signal BOOST_B, as further described in detail below. The boost control signal BOOST_B may drive the negative boost NMOS transistor 405 to couple a PMOS gate voltage of the PMOS pass gate 220 below the negative power supply level VSS in order to increase the voltage across the gate-source (Vgs) across the PMOS pass gate 220. This allows a lower voltage to pass through the PMOS pass gate 220.

According to some embodiments, adequate sense differential is provided at low operating supply voltages while still providing for isolation between an array bit cell (e.g., 200) and a sense amplifier (e.g., 160). The negative boost driver circuit 230 may tri-state the local read column select inverter 320, which allows the read column select signal (e.g., RCS_B) to couple below the negative power supply level VSS with the aid of a boost capacitance from the negative boost NMOS transistor 405. The tri-stating of the read column select inverter 320 and negative boosting of the read column select signal RCS_B are achieved with the same control signal (i.e., BOOST_B), thereby significantly minimizing the devices required for the implementation. The NMOS boost control transistor 310 may function as a tri-state driver. The tri-state driver and the boost capacitance may be implemented using only two circuit elements, and may be physically disposed in the column 30, resulting in only a small increase in area. And any increase in power consumption due to the two additional circuit elements in the column 30 is more than offset by a reduction in the power supply level VDD.

After the RCS_B signal reaches the negative power supply level VSS, the BOOST_B signal may be used as an aggressor to couple the RCS_B signal below the negative power supply level VSS. The same BOOST_B signal also turns OFF the NMOS boost control transistor 310, thereby cutting off the path from RCS_B to VSS, thereby tri-stating the RCS_B driver 320. This allows the RCS_B signal to stay below the negative power supply level VSS until sensing is complete.

In some embodiments, a gate of the boost control transistor 310 may receive the boost control signal BOOST_B. In some embodiments, a source of the boost control transistor 310 may be coupled to the negative power supply level VSS. The boost control transistor 310 may pass the negative power supply level VSS to the read column select inverter 320 responsive to the boost control signal BOOST_B to tri-state the read column select inverter 320. The negative boost NMOS transistor 405 may negatively boost the read column select signal (e.g., RCS_B) below the negative power supply level VSS responsive to the boost control signal BOOST_B contemporaneously with the read column select inverter 320 being tri-stated by the NMOS boost control transistor 310.

The read column select inverter 320 may include an NMOS transistor 330 and a PMOS transistor 335. The boost control transistor 310 may be coupled to the NMOS transistor 330 of the read column select inverter 320. The read column select signal RCS_B may be referred to as an inverted read column select signal RCS_B. In some embodiments, a gate of the NMOS transistor 330 of the read column select inverter 320 may receive a non-inverted read column select signal RCS. In some embodiments, a gate of the PMOS transistor 335 of the read column select inverter 320 may receive the non-inverted read column select signal RCS. In some embodiments, a drain of the boost control transistor 310 may be coupled to a source of the NMOS transistor 330 of the read column select inverter 320.

The PMOS pass gate 320 includes a first PMOS transistor 340 and a second PMOS transistor 345. The negative boost NMOS transistor 405 may be coupled to a gate of the first PMOS transistor 340 and to a gate of the second PMOS transistor 345 of the PMOS pass gate 220. In some embodiments, a drain of the NMOS transistor 330 of the read column select inverter 320 may be coupled to the gate of the first PMOS transistor 340 of the PMOS pass gate 220, and to the gate of the second PMOS transistor 345 of the PMOS pass gate 220. In some embodiments, a drain of the PMOS transistor 335 of the read column select inverter 320 may be coupled to the gate of the first PMOS transistor 340 of the PMOS pass gate 220, and to the gate of the second PMOS transistor 345 of the PMOS pass gate 220. In some embodiments, a source of the PMOS transistor 335 of the read column select inverter 320 may be coupled to a positive power supply level VDD.

In some embodiments, a gate of the negative boost NMOS transistor 405 may receive the boost control signal BOOST_B. In some embodiments, a source of the negative boost NMOS transistor 405 may be coupled to a gate of the first PMOS transistor 340 of the PMOS pass gate 220, and to a gate of the second PMOS transistor 345 of the PMOS pass gate 220. In addition, a drain of the negative boost NMOS transistor 405 may be coupled to the gate of the first PMOS transistor 340 of the PMOS pass gate 220, and to the gate of the second PMOS transistor 345 of the PMOS pass gate 220.

Figure 5:
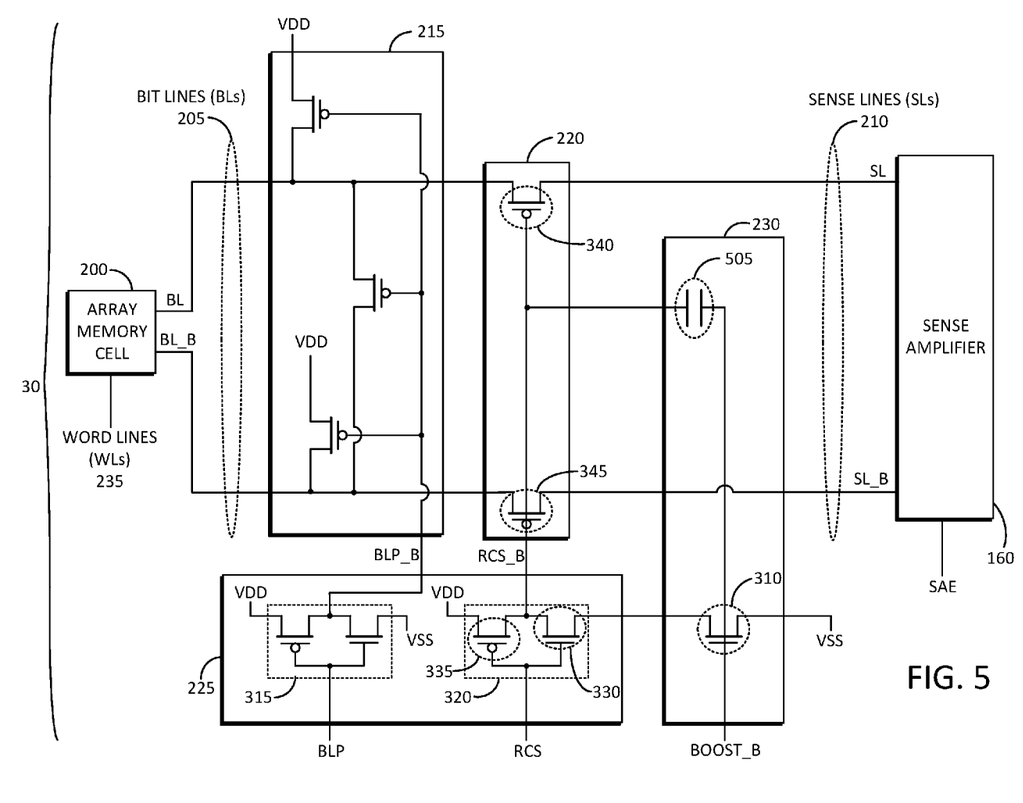
FIG. 5 is an example circuit diagram of a column of the memory cell array of the memory device of FIG. 1, including a third example of a negative boost circuit in accordance with some embodiments.

FIG. 5 is an example circuit diagram of a column of the memory cell array of the memory device of FIG. 1, including a third example of a negative boost circuit in accordance with some embodiments. Some of the elements of FIG. 5 are described above with reference to FIG. 3, and therefore, a detailed description of such elements is not necessarily repeated. In some embodiments, the negative boost circuit 230 includes a negative boost element 505. The negative boost element 505 may be a capacitor.

The negative boost capacitor 505 may negatively boost a read column select signal (e.g., RCS_B) below a negative power supply level VSS dependent on the boost control signal BOOST_B. The NMOS boost control transistor 310 may be coupled to the negative boost capacitor 505 and to the read column select inverter 320. The NMOS boost control transistor 310 may tri-state the read column select inverter 320 dependent on the boost control signal BOOST_B, as further described in detail below. The boost control signal BOOST_B may drive the negative boost capacitor 505 to couple a PMOS gate voltage of the PMOS pass gate 220 below the negative power supply level VSS in order to increase the voltage across the gate-source (Vgs) across the PMOS pass gate 220. This allows a lower voltage to pass through the PMOS pass gate 220.

According to some embodiments, adequate sense differential is provided at low operating supply voltages while still providing for isolation between an array bit cell (e.g., 200) and a sense amplifier (e.g., 160). The negative boost driver circuit 230 may tri-state the local read column select inverter 320, which allows the read column select signal (e.g., RCS_B) to couple below the negative power supply level VSS with the aid of a boost capacitance from the negative boost capacitor 505. The tri-stating of the read column select inverter 320 and negative boosting of the read column select signal RCS_B are achieved with the same control signal (i.e., BOOST_B), thereby significantly minimizing the devices required for the implementation. The NMOS boost control transistor 310 may function as a tri-state driver. The tri-state driver and the boost capacitance may be implemented using only two circuit elements, and may be physically disposed in the column 30, resulting in only a small increase in area. And any increase in power consumption due to the two additional circuit elements in the column 30 is more than offset by a reduction in the power supply level VDD.

After the RCS_B signal reaches the negative power supply level VSS, the BOOST_B signal may be used as an aggressor to couple the RCS_B signal below the negative power supply level VSS. The same BOOST_B signal also turns OFF the NMOS boost control transistor 310, thereby cutting off the path from RCS_B to VSS, thereby tri-stating the RCS_B driver 320. This allows the RCS_B signal to stay below the negative power supply level VSS until sensing is complete.

In some embodiments, a gate of the boost control transistor 310 may receive the boost control signal BOOST_B. In some embodiments, a source of the boost control transistor 310 may be coupled to the negative power supply level VSS. The boost control transistor 310 may pass the negative power supply level VSS to the read column select inverter 320 responsive to the boost control signal BOOST_B to tri-state the read column select inverter 320. The negative boost capacitor 505 may negatively boost the read column select signal (e.g., RCS_B) below the negative power supply level VSS responsive to the boost control signal BOOST_B contemporaneously with the read column select inverter 320 being tri-stated by the NMOS boost control transistor 310.

The read column select inverter 320 may include an NMOS transistor 330 and a PMOS transistor 335. The boost control transistor 310 may be coupled to the NMOS transistor 330 of the read column select inverter 320. The read column select signal RCS_B may be referred to as an inverted read column select signal RCS_B. In some embodiments, a gate of the NMOS transistor 330 of the read column select inverter 320 may receive a non-inverted read column select signal RCS. In some embodiments, a gate of the PMOS transistor 335 of the read column select inverter 320 may receive the non-inverted read column select signal RCS. In some embodiments, a drain of the boost control transistor 310 may be coupled to a source of the NMOS transistor 330 of the read column select inverter 320.

The PMOS pass gate 320 includes a first PMOS transistor 340 and a second PMOS transistor 345. The negative boost capacitor 505 may be coupled to a gate of the first PMOS transistor 340 and to a gate of the second PMOS transistor 345 of the PMOS pass gate 220. In some embodiments, a drain of the NMOS transistor 330 of the read column select inverter 320 may be coupled to the gate of the first PMOS transistor 340 of the PMOS pass gate 220, and to the gate of the second PMOS transistor 345 of the PMOS pass gate 220. In some embodiments, a drain of the PMOS transistor 335 of the read column select inverter 320 may be coupled to the gate of the first PMOS transistor 340 of the PMOS pass gate 220, and to the gate of the second PMOS transistor 345 of the PMOS pass gate 220. In some embodiments, a source of the PMOS transistor 335 of the read column select inverter 320 may be coupled to a positive power supply level VDD.

In some embodiments, a first conductor of the negative boost capacitor 505 may receive the boost control signal BOOST_B. In some embodiments, a second conductor of the negative boost capacitor 505 is coupled to a gate of the first PMOS transistor 340 of the PMOS pass gate 220, and to a gate of the second PMOS transistor 345 of the PMOS pass gate 220.

Figure 6:
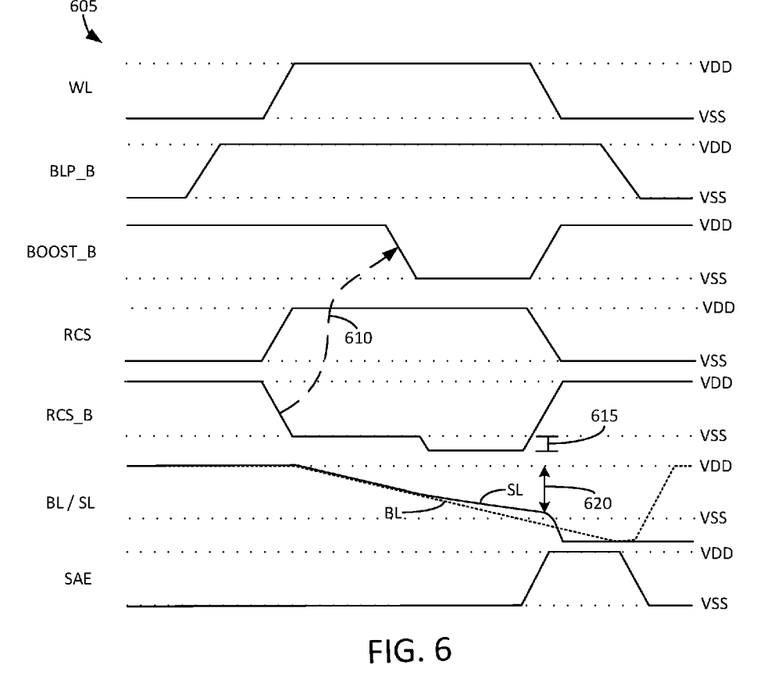
FIG. 6 is an example waveform diagram in accordance with some embodiments.
Figure 7:
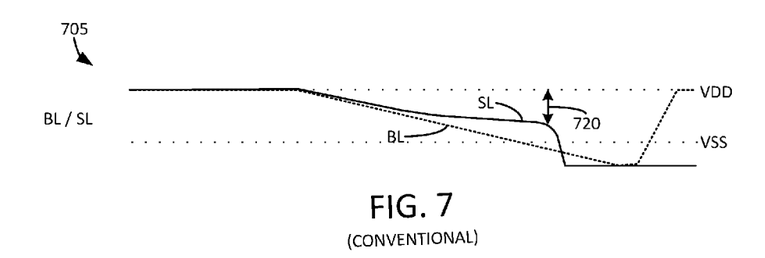
FIG. 7 is an example conventional waveform diagram of bit line and sense line signals.

FIG. 6 is an example waveform diagram 605 in accordance with some embodiments. FIG. 7 is an example conventional waveform diagram 705 of bit line and sense line signals. Reference is now made to FIGS. 6 and 7.

The waveform diagram 605 shows a timing sequence for various control signals of the memory device 105 (of FIG. 1). The control signals are sequenced to enable reading information from the memory device 105. The control signals include word line (WL), row column select (RCS_B), sense amp enable (SAE), precharge (BLP_B), and boost control (BOOST_B). The array memory cell (e.g., 200 of FIG. 2) must pull the sense nodes low enough to establish the required differential voltage for correct sensing when SAE goes high (e.g., set to a high logical level). In accordance with some embodiments, the BOOST_B is asserted at 610 (e.g., set to a low logical level) in response to the RCS_B signal going low (e.g., being set to a low logical level). In response to the BOOST_B signal, the RCS_B signal is negatively boosted below VSS as shown at 615. Moreover, the source line (SL) node is pulled lower than it otherwise would be pulled, creating a greater differential 620 across the sense amplifier 160 (of FIG. 1).

In comparison to the conventional voltage differential 720 as shown in FIG. 7, the voltage differential 620 as shown in FIG. 6 is greater, thereby allowing the memory device 105 to operate at a lower voltage. In other words, the positive power supply level VDD may be lowered for the memory device 105, thereby reducing power consumption. This is particularly advantageous for mobile devices in which battery life may be extended by lowering the power consumption.

Figure 8:
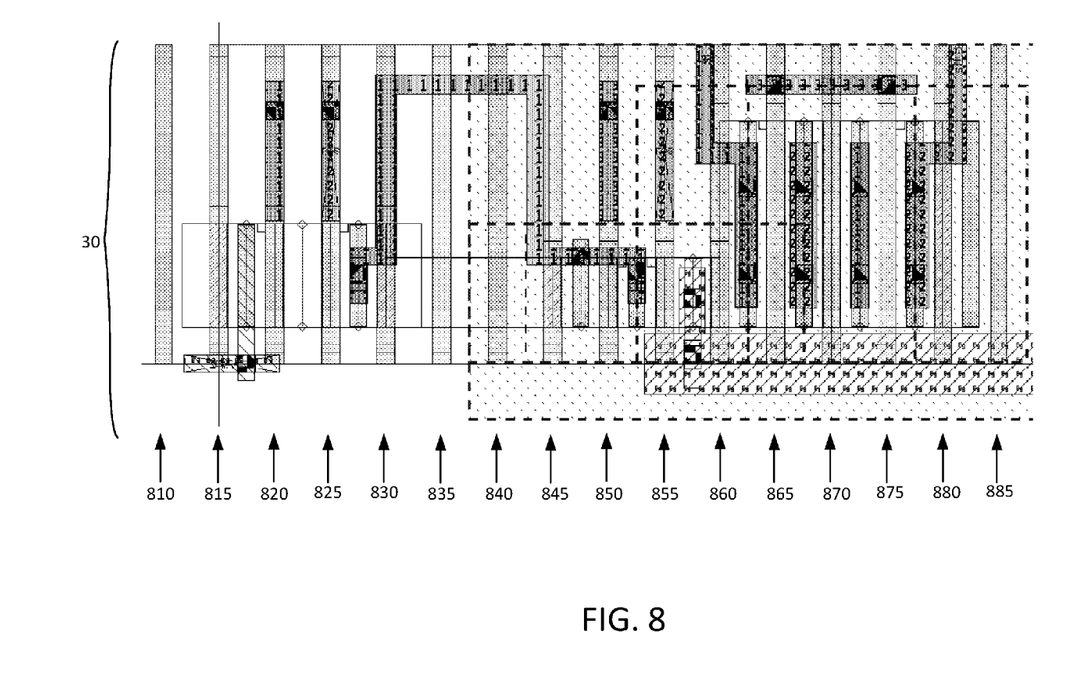
FIG. 8 is an example layout diagram of a column of the memory cell array of the memory device of FIG. 1 in accordance with some embodiments.

FIG. 8 is an example circuit layout diagram of a column 30 of the memory cell array 110 of the memory device 105 of FIG. 1 in accordance with some embodiments. In some embodiments, the negative boost element (e.g., negative boost PMOS transistor 305, negative boost NMOS transistor 405, or negative boost capacitor 505) and the NMOS boost control transistor 310 may be implemented as a total of two additional devices that amount to two poly pitches in each column 30.

As shown in FIG. 8, the circuit layout may include the NMOS boost control transistor 310 in column 30 associated with gate poly pitch 820. The negative boost element (e.g., 305, 405, or 505) may be associated with gate poly pitch 850. It will be understood that other arrangements of the NMOS boost control transistor and the negative boost element may be made within the column 30 without departing from the inventive concepts disclosed herein.

In some embodiments, gates 810 and 815 are dummy gates, gate 820 is associated with the NMOS boost control transistor 310; gate 825 is associated with NMOS transistor 330 of the read column select inverter 320; gates 830, 835, 840 and 845 are dummy gates; gate 850 is associated with the negative boost element (e.g., 305, 405, or 505); gate 855 is associated with the PMOS transistor 335 of the read column select inverter 320; gate 860 is a dummy gate; gate 865 is associated with the first PMOS transistor 340 of the PMOS pass gate 220; gate 870 is a dummy gate; gate 875 is associated with the first PMOS transistor 345 of the PMOS pass gate 220; and gates 880 and 885 are dummy gates. In some embodiments, the gates are polysilicon gates. It will be understood that other arrangements of the gates and associated circuit elements may be made within the column 30 without departing from the inventive concepts disclosed herein.

Embodiments disclosed herein allow for a lower operating voltage by providing a reduction in the PMOS pass gate voltage to below VSS, thus allowing a lower value of read signal to pass to the sense amplifier. In some embodiments, a negative boost element may be added in the array column to couple the signal connected to gate terminals of the PMOS pass gate to be lower than VSS. The boost control signal lowers the threshold voltage of the PMOS pass gate, and enables more voltage differential across the sense amplifier. The amount of negative boost may depend on the ratio of the boost capacitance and the read column select signal capacitance.

Figure 9:
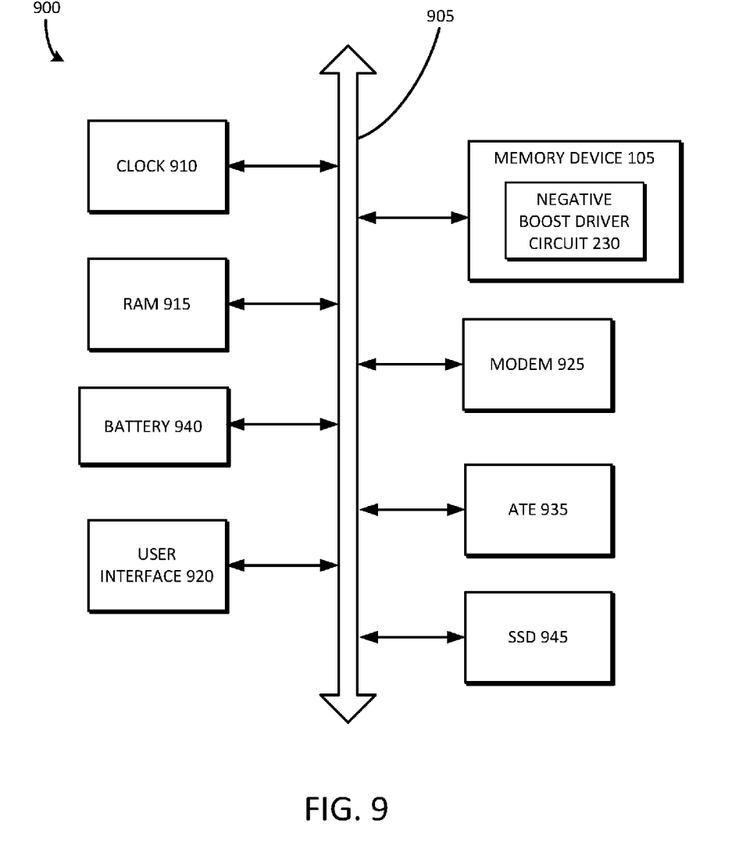
FIG. 9 is an example system diagram of a computing system including the memory device of FIG. 1 in accordance with some embodiments.

FIG. 9 is an example system diagram of a computing system 900 including the memory device 105 of FIG. 1 in accordance with some embodiments. The memory device 105 may include the negative boost driver circuit 230 described in detail above. The memory device 105 may be electrically coupled to a system bus 905. The computing system 900 may also include a clock 910, a random access memory (RAM) 915, a user interface 920, a modem 925 such as a baseband chipset, and/or automated test equipment (ATE) 935, any or all of which may be electrically coupled to the system bus 905.

If the computing system 900 is a mobile device, it may further include a battery 940, which powers the computing system 900. Although not shown in FIG. 9, the computing system 900 may further include an application chipset, a camera image processor (CIS), a mobile DRAM, and the like. The system 900 may include a solid state drive/disk (SSD) 945, which uses a nonvolatile memory to store data.

In example embodiments, the computing system 900 may be used as computer, portable computer, Ultra Mobile PC (UMPC), workstation, net-book, PDA, web tablet, wireless phone, mobile phone, smart phone, e-book, PMP (portable multimedia player), digital camera, digital audio recorder/player, digital picture/video recorder/player, portable game machine, navigation system, black box, 3-dimensional television, a device capable of transmitting and receiving information at a wireless circumstance, one of various electronic devices constituting home network, one of various electronic devices constituting computer network, one of various electronic devices constituting a telematics network, RFID, or one of various electronic devices constituting a computing system.

Embodiments of the inventive concept may include a non-transitory machine-readable medium comprising instructions executable by one or more processors, the instructions comprising instructions to perform the elements of the inventive concepts as described herein.

What is claimed is:

1. A read column select negative boost driver of a memory device, the negative boost driver comprising:
   a negative boost element coupled to a P-type metal-oxide-semiconductor (PMOS) pass gate, and configured to negatively boost a read column select signal below a negative power supply level VSS dependent on a boost control signal; and
   an N-type metal-oxide-semiconductor (NMOS) boost control transistor coupled to the negative boost element and to a read column select inverter, and configured to tri-state the read column select inverter dependent on the boost control signal.

2. The negative boost driver of claim 1, wherein the negative boost element is a capacitor.

3. The negative boost driver of claim 1, wherein the negative boost element is a PMOS transistor.

4. The negative boost driver of claim 1, wherein the negative boost element is an NMOS transistor.

5. The negative boost driver of claim 1, wherein a gate of the NMOS boost control transistor is configured to receive the boost control signal.

6. The negative boost driver of claim 1, wherein a source of the NMOS boost control transistor is coupled to the negative power supply level VSS.

7. The negative boost driver of claim 6, wherein: the NMOS boost control transistor is configured to pass the negative power supply level VSS to the read column select inverter responsive to the boost control signal to tri-state the read column select inverter; and
   the negative boost element is configured to negatively boost the read column select signal below the negative power supply level VSS responsive to the boost control signal contemporaneously with the read column select inverter being tri-stated.

8. The negative boost driver of claim 1, wherein: the read column select inverter includes an NMOS transistor and a PMOS transistor; and the NMOS boost control transistor is coupled to the NMOS transistor of the read column select inverter.

9. The negative boost driver of claim 8, wherein:
   the read column select signal is referred to as an inverted read column select signal;
   a gate of the NMOS transistor of the read column select inverter is configured to receive a non-inverted read column select signal;
   a gate of the PMOS transistor of the read column select inverter is configured to receive the non-inverted read column select signal; and
   a drain of the NMOS boost control transistor is coupled to a source of the NMOS transistor of the read column select inverter.

10. The negative boost driver of claim 9, wherein:
    the PMOS pass gate includes a first PMOS transistor and a second PMOS transistor; and
    the negative boost element is coupled to a gate of the first PMOS transistor and to a gate of the second PMOS transistor.

11. The negative boost driver of claim 10, wherein:
    a drain of the NMOS transistor of the read column select inverter is coupled to the gate of the first PMOS transistor of the PMOS pass gate, and to the gate of the second PMOS transistor of the PMOS pass gate;
    a drain of the PMOS transistor of the read column select inverter is coupled to the gate of the first PMOS transistor of the PMOS pass gate, and to the gate of the second PMOS transistor of the PMOS pass gate; and
    a source of the PMOS transistor of the read column select inverter is coupled to a positive power supply level VDD.

12. The negative boost driver of claim 1, wherein:
    the negative boost element is a capacitor;
    a first conductor of the negative boost capacitor is configured to receive the boost control signal;
    the PMOS pass gate includes a first PMOS transistor and a second PMOS transistor; and
    a second conductor of the negative boost capacitor is coupled to a gate of the first PMOS transistor of the PMOS pass gate, and to a gate of the second PMOS transistor of the PMOS pass gate.

13. The negative boost driver of claim 1, wherein:
    the negative boost element is a PMOS transistor;
    a gate of the negative boost PMOS transistor is configured to receive the boost control signal;
    the PMOS pass gate includes a first PMOS transistor and a second PMOS transistor;
    a source of the negative boost PMOS transistor is coupled to a gate of the first PMOS transistor of the PMOS pass gate, and to a gate of the second PMOS transistor of the PMOS pass gate; and
    a drain of the negative boost PMOS transistor is coupled to the gate of the first PMOS transistor of the PMOS pass gate, and to the gate of the second PMOS transistor of the PMOS pass gate.

14. The negative boost driver of claim 1, wherein:
    the negative boost element is an NMOS transistor;
    a gate of the negative boost NMOS transistor is configured to receive the boost control signal;
    the PMOS pass gate includes a first PMOS transistor and a second PMOS transistor;
    a source of the negative boost NMOS transistor is coupled to a gate of the first PMOS transistor of the PMOS pass gate, and to a gate of the second PMOS transistor of the PMOS pass gate; and
    a drain of the negative boost NMOS transistor is coupled to the gate of the first PMOS transistor of the PMOS pass gate, and to the gate of the second PMOS transistor of the PMOS pass gate.

15. A static random access memory (SRAM), comprising:
    a memory cell array including a plurality of memory cells arranged in columns, wherein each of the memory cells is coupled to a corresponding P-type metal-oxide-semiconductor (PMOS) pass gate from among a plurality of PMOS pass gates;
    a sense amplifier section including a plurality of sense amplifiers, wherein each of the sense amplifiers is associated with a corresponding one of the columns;
    a plurality of negative boost elements each coupled to the corresponding PMOS pass gate from among the plurality of PMOS pass gates, and configured to negatively boost a read column select signal below a negative power supply level VSS dependent on a boost control signal; and a plurality of N-type metal-oxide-semiconductor (NMOS) boost control transistors each coupled to a corresponding one of the negative boost elements and to a corresponding read column select inverter from among a plurality of read column select inverters, and configured to tri-state the corresponding read column select inverter dependent on the boost control signal.

16. The negative boost driver of claim 15, wherein each of the negative boost elements is a capacitor.

17. The negative boost driver of claim 15, wherein each of the negative boost elements is a PMOS transistor.

18. The negative boost driver of claim 15, wherein each of the negative boost elements is an NMOS transistor.

19. The negative boost driver of claim 15, wherein a gate of each of the NMOS boost control transistors is configured to receive the boost control signal.

20. The negative boost driver of claim 15, wherein:
a source of each of the boost control transistors is coupled to the negative power supply level VSS;
each of the NMOS boost control transistors is configured to pass the negative power supply level VSS to a corresponding read column select inverter from among the plurality of read column select inverters responsive to the boost control signal to tri-state the corresponding read column select inverter; and
each of the negative boost elements is configured to negatively boost the read column select signal below the negative power supply level VSS responsive to the boost control signal contemporaneously with the corresponding read column select inverter being tri-stated.

* * * * *